United States Patent [19]
Yamazaki et al.

[11] Patent Number: 6,077,759
[45] Date of Patent: Jun. 20, 2000

[54] METHOD OF PRODUCING SEMICONDUCTOR DEVICE

[75] Inventors: Shunpei Yamazaki, Tokyo; Satoshi Teramoto, Kanagawa, both of Japan

[73] Assignee: Semiconductor Energy Laboratory Co.,, Kanagawa-ken, Japan

[21] Appl. No.: 08/928,746

[22] Filed: Sep. 12, 1997

Related U.S. Application Data

[63] Continuation of application No. 08/655,409, May 30, 1996, abandoned.

[30] Foreign Application Priority Data

May 31, 1995 [JP] Japan .................................. 7-158644

[51] Int. Cl.[7] .................................................. C23C 16/00
[52] U.S. Cl. ........................... 438/487; 438/485; 117/103
[58] Field of Search .................. 117/8, 103; 118/723 E; 437/101, 233; 438/485, 486, 487; 148/1.5, 508

[56] References Cited

U.S. PATENT DOCUMENTS

| | | |
|---|---|---|
| 4,331,486 | 5/1982 | Chenevas-Paule et al. . |
| 4,690,830 | 9/1987 | Dickson et al. . |
| 5,210,050 | 5/1993 | Ishihara ..................................... 437/101 |
| 5,288,658 | 2/1994 | Yamazaki et al. ....................... 437/101 |
| 5,290,712 | 3/1994 | Sato et al. .................................... 117/8 |
| 5,306,651 | 4/1994 | Masumo . |
| 5,352,291 | 10/1994 | Zhang . |
| 5,366,926 | 11/1994 | Mei et al. . |
| 5,424,230 | 6/1995 | Wakai . |
| 5,505,794 | 4/1996 | Nakayama et al. . |
| 5,529,937 | 6/1996 | Zhang et al. ................................ 117/8 |
| 5,534,070 | 7/1996 | Okamura et al. .................... 118/723 E |
| 5,540,781 | 7/1996 | Yamagami et al. ................. 118/723 E |
| 5,637,515 | 6/1997 | Takemura . |
| 5,766,344 | 9/1992 | Zhang et al. . |
| 5,808,321 | 6/1994 | Mitanaga et al. . |

FOREIGN PATENT DOCUMENTS 0131512  6/1988  Japan ..................................... 437/101

OTHER PUBLICATIONS

J. I. Pankove, M. A. Lampert and M. L. Tarng, "Hydrogenation and Dehydrogenation of Amorphous and Crystalline Silicon," Appl. Phys. Lett., 32 (7), p. 439, Apr. 1, 1978.

S. Takenaka et al., High Mobility Poly–Si Film Transistors Using Solid Phase Crystallized a–Si Films Deposited by Plasma–Enhanced, *Japanese Journal of Applied Physics*, vol. 29, No. 12 (Dec. 1990) pp. 2380–2383.

*Primary Examiner*—Charles Bowers
*Assistant Examiner*—Martin Sulsky
*Attorney, Agent, or Firm*—Fish & Richardson P.C.

[57] ABSTRACT

A silicon oxide film is formed as an under film on a glass substrate and then an amorphous silicon film is formed thereon. Using hydrogen plasma produced by a frequency of 50 to 100 MHz, the amorphous silicon film formed on the glass substrate is processed. In this plasma processing, hydrogen atoms in the amorphous silicon film is combined with hydrogen atoms in the plasma with a high energy state, so that a gas is generated and the dehydrogenation from the amorphous silicon film progresses. After the dehydrogenation is completed, the heating treatment is performed to crystallize the amorphous silicon film and to transform the amorphous silicon film into a crystalline silicon film.

35 Claims, 4 Drawing Sheets

P+ ION IMPLANTATION

METHOD OF PRODUCING SEMICONDUCTOR DEVICE

This is a continuation of application Ser. No. 08/655,409, filed May 30, 1996 now abandoned.

BACKGROUND OF THE INVENTION

1. Field of the Invention

The present invention disclosed in the specification relates to a method for producing a crystalline silicon film on a substrate having an insulating surface such as a glass substrate.

2. Description of the Related Art

A technique for constructing a thin film transistor (TFT) using a silicon thin film formed on a glass substrate has been concerned. The TFT is utilized mainly in an active matrix type liquid crystal electro-optical device and also in various thin film integrated circuits. In the liquid crystal electro-optical device, a liquid crystal is injected between a pair of glass substrates. An electric field is applied to the liquid crystal, to change an optical characteristic of the liquid crystal is changed and image display is performed.

In particular, the active matrix type liquid crystal display device is characterized in that a TFT is disposed for each pixel and charges stored in a pixel electrode are controlled by using the TFT as a switch. Since the active matrix type liquid crystal display device can display a fine (high resolution) image at a high speed, it is utilized for a display device of various electronic devices such as a portable word processor and a portable computer.

In general, an amorphous silicon thin film is used for a TFT utilized in the active matrix type liquid crystal display device. However, in the TFT using an amorphous silicon thin film, there are problems that (1) since its characteristic is low, a high quality image cannot be displayed and (2) a peripheral circuit for driving TFTs disposed in pixels cannot be constructed.

It can be considered that the above problem (2) includes two problems. That is, one is that since a P-channel type TFT cannot be formed in practice using an amorphous silicon thin film, a complementary metal-oxide semiconductor (CMOS) circuit cannot be constructed, and the other is that since the TFT using an amorphous silicon thin film cannot be operated at a high speed and a large amount of electric current cannot be supplied, a peripheral driver circuit cannot be constructed.

As a method to solve the above problems, there is a technique for forming a TFT using a crystalline silicon thin film. As a method for obtaining the crystalline silicon thin film, there are a method for thermally processing an amorphous silicon film and a method for irradiating an amorphous silicon thin film with a laser light.

A method for crystallizing an amorphous silicon film by thermal processing includes in general a problem described below. When a TFT utilized in a liquid crystal electro-optical device is constructed, it is necessary to form the TFT on a transparent substrate. As the transparent substrate, there are a quartz substrate and a glass substrate. However, since the quartz substrate is expensive, it cannot be utilized in the liquid crystal electro-optical device where cost reduction is an important technical problem. Thus, a glass substrate is utilized generally. However, there is a problem that a heat resistance temperature of the glass substrate is low.

In general, Corning 7059 glass substrate used as a glass substrate utilized in a liquid crystal electro-optical device has a distortion point of 593° C. When it is heated at a temperature no lower than this temperature (the distortion point), the substrate is distorted markedly. Also, Corning 1737 glass substrate is known as a glass substrate which can be heated at a high temperature, (a distortion point is 667° C.). However, even though this glass substrate is used, when its area is enlarged to a large area, it is not desired to perform heating treatment for 10 hours or longer at 600° C. or higher.

In particular, since a liquid crystal electro-optical device tends to make a large area, it is necessary to suppress shrinking and distortion of the substrate. To solve this problem, it is desired that a crystallization temperature is set to be about 550° C. or lower and a heating time is several hours or shorter.

Further, a technique for crystallizing an amorphous silicon film by laser light irradiation is also known. This method has the advantage that it is not necessary to perform heating treatment at a temperature that a problem occurs. However, there is a problem that it is difficult to obtain an effect by laser light irradiation at high repeatability.

SUMMARY OF THE INVENTION

An object of the present invention disclosed in the specification is to provide a technique for obtaining a crystalline silicon film by heating treatment at a temperature that a glass substrate can withstand. In addition to the above object, another object of the present invention is to obtain a crystalline silicon film having a desired electrical characteristic at high repeatability.

The present invention disclosed in the specification is characterized in that a process includes the step of plasma-processing an amorphous silicon film, wherein a plasma in the plasma-processing is produced by applying a high frequency energy to a gas containing mainly hydrogen, and a frequency of the high frequency energy is 30 to 120 MHz.

In the above process, it is preferable to use a film formed by low pressure thermal chemical vapor deposition (CVD) as an amorphous silicon film. This is because that in the amorphous silicon film formed by low pressure thermal CVD, hydrogen content is low, and a state that crystallization is further easy can be obtained by performing a dehydrogenation process using plasma-processing.

It is required that the gas containing mainly hydrogen contains hydrogen or helium at 50 volume % or more.

It is effective to heat an amorphous silicon film at 450° C. to 700° C., preferably 500° C. to 700° C., further preferably 550° C. to 700° C. while plasma-processing, so as to promote further an effect by plasma-processing. In general, even though an amorphous silicon film is thermally processed at 700° C. for several hours (3 hours or shorter), it is not crystallized. Thus, by using this heating treatment together, the amorphous silicon film is not crystallized. Also, since plasma processing time is 1 hour or shorter, in a glass substrate such as a Corning 1737 glass substrate, it is permitted that heating treatment is performed at a high temperature of about 700° C. In a case wherein a glass substrate having a large scale area is used, it is necessary to reduce a heating temperature until an admitted temperature.

By the heating treatment after the plasma processing, a crystalline silicon film can be obtained. This heating treatment can be performed at 500 to 550° C. Also, a heating time is about 4 to 10 hours and thus short. When the heating treatment is performed at about 550° C. or less, even though a heating time is about 10 hours, a glass substrate can be resisted in general.

In the above, it is effective to perform the heating treatment and/or the laser light irradiation after the plasma processing. For example, the laser light irradiation is performed after the heating treatment, so that an amorphous component which is not crystallized by the heating treatment can be crystallized and a crystalline silicon film having high crystallinity can be obtained.

Also, a frequency of a high frequency energy is preferably 50 to 100 MHz. This is because the energy in this frequency range promotes effectively the release of hydrogen from a film.

Further, it is effective that, after the plasma processing, a metal element which promotes crystallization of silicon is disposed in contact with the surface of an amorphous silicon film, and the amorphous silicon film is transformed into a crystalline silicon film by the heating treatment. By using the metal element, the crystallization can be made by the heating treatment at a low temperature of 550° C. or less for 5 hours or shorter.

As the metal element which promotes crystallization of silicon, at least one element selected from the groups including Fe, Co, Ni, Ru, Rh, Pd, Os, Ir, Pt, Cu, Au can be used. In particular, Ni element is preferably used from a viewpoint of its effect and reproducibility.

It is preferable that a method for applying a solution containing the above metal element to the surface of an amorphous silicon film is used. In this method, by adjusting a concentration of the metal elements in the solution, the concentration of the metal elements which remain finally in the silicon film can be controlled easily. It is preferable that the concentration of the metal elements which remain finally in the silicon film is about $1 \times 10^{16}$ atoms $cm^{-3}$ to $5 \times 10^{19}$ atoms $cm^{-3}$. The concentration of this metal element is defined as a minimum value of a measurement value obtained by secondary ion mass spectrometry (SIMS).

In the present invention disclosed in the specification, the reason why a high frequency energy having 30 to 120 MHz, preferably 50 to 100 MHz is used is as follows. FIG. 4 shows a result of a spin density in a film which is measured by electron spin resonance after the hydrogen plasma processing for an amorphous silicon film. A vertical axis represents a normalized value of a spin density. A horizontal axis represents a frequency of the high frequency energy used at the hydrogen plasma processing. In FIG. 4, a curve 40 represents a frequency dependence of a spin density in a case wherein the hydrogen plasma processing is performed while heating at 350° C., a curve 41 represents a frequency dependence of a spin density in a case wherein the hydrogen plasma processing is performed while heating at 500° C., and a curve 42 represents a frequency dependence of a spin density in a case wherein the hydrogen plasma processing is performed while heating at 620° C.

It is considered that the spin density is an index for estimating the number of dangling bonds of silicon in a film. Thus, it is understood that FIG. 4 represents the increase in the number of dangling bonds by dehydrogenation due to the plasma processing.

In FIG. 4, if a spin density value is larger than half its maximum value, it may be significant. Thus, a significant effect is obtained in a case wherein a frequency of about 30 MHz to 120 MHz is used. Also, in order to obtain such a significant effect, it is effective to heat an amorphous silicon film at 500° C. or higher. The upper limit of the heating temperature is about 700° C. in general, although it depends on a kind of a glass substrate.

It may be most effective to obtain an effect with 75% or more of a maximum value of a spin density. In this state, a frequency for producing plasma is preferably 50 MHz to 100 MHz and it is also effective to heat an amorphous silicon film at 550° C. to 700° C.

By making a gas containing mainly hydrogen a plasma state using a high frequency energy having a frequency 30 to 120 MHz, a hydrogen atom can be ionized effectively. By using this plasma, an amorphous silicon film is processed, so that dehydrogenation from the amorphous silicon film can be promoted and a state in which it is easily crystallized can be obtained. Also, by the heating treatment and/or the laser light irradiation, a crystalline silicon film can be obtained with high reproducibility.

DETAILED DESCRIPTION OF THE PREFERRED EMBODIMENTS

Embodiment 1

In the embodiment, an amorphous silicon film is formed on a glass substrate and is subjected to a hydrogen plasma processing, and then a heating treatment is performed, thereby to transform the amorphous silicon film into a crystalline silicon film.

Figure 1A:
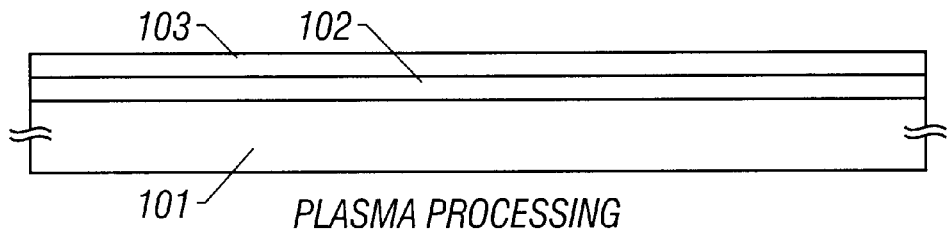
FIGS. 1A to 1D shows a process for forming a crystalline silicon film.

FIGS. 1A to 1D show a process for forming a crystalline silicon film according to the embodiment. A silicon oxide film is formed as an under film 102 on a glass substrate 101 by plasma chemical vapor deposition (plasma CVD) or sputtering. An amorphous silicon film 103 is formed thereon by plasma CVD or low pressure thermal CVD. The under film has a thickness of 3000 Å, and the amorphous silicon film has a thickness of 500 Å. (FIG. 1A)

Figure 2:
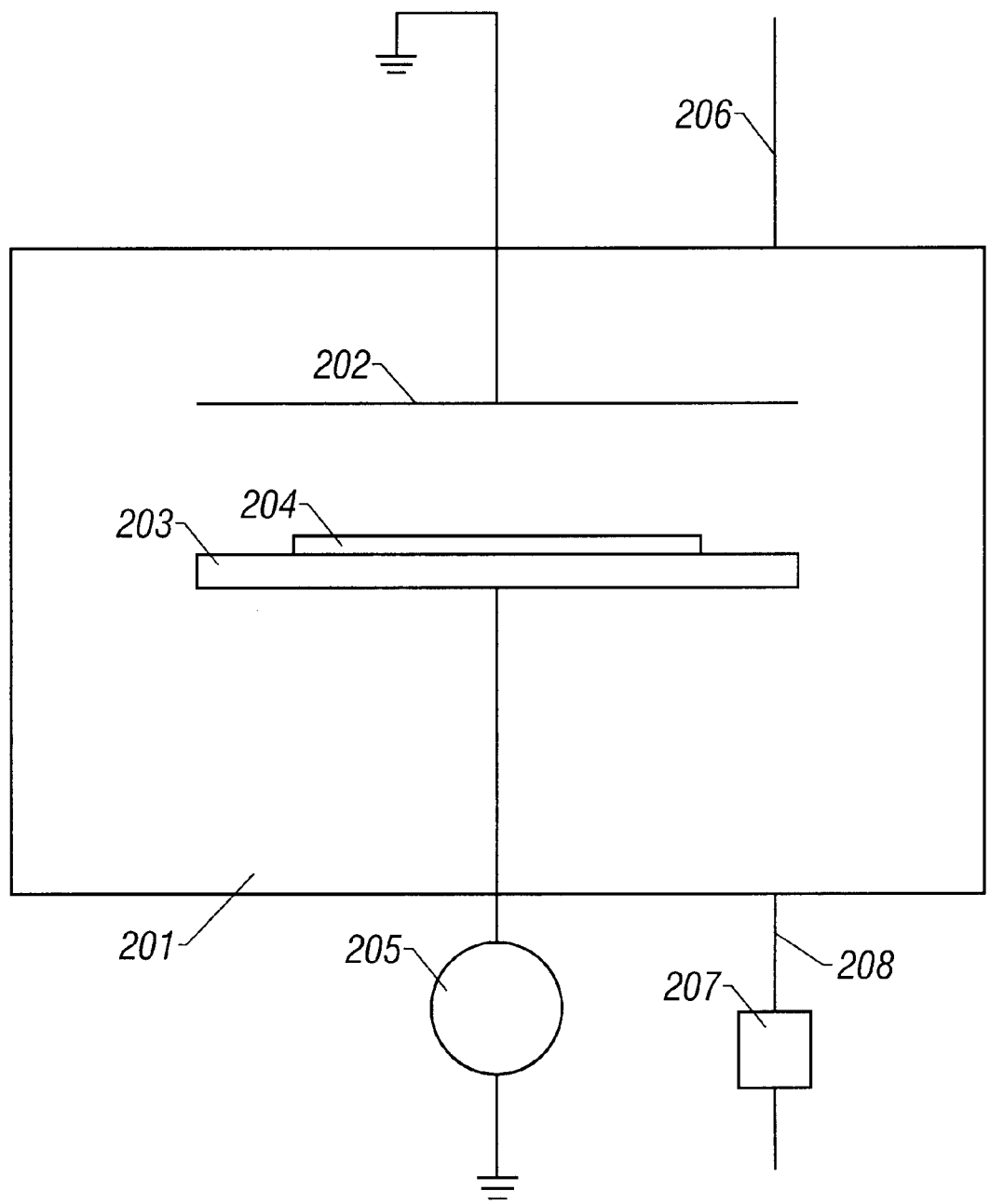
FIG. 2 shows an outline of an apparatus for plasma processing.

Using the apparatus of FIG. 2, hydrogen plasma processing is performed. In the apparatus of FIG. 2, a pair of electrodes 202 and 203 are provided in a low pressure chamber 201 made of stainless steel. The electrode 203 is also used as a substrate holder. A substrate 204 is placed on the substrate holder 203. The substrate holder 203 used also as one of the electrodes has a heater so as to heat the substrate 204 at a necessary temperature. Also, a positive or negative bias can be applied to the substrate holder 203.

A necessary gas introducing system 206 and an exhaust system 208 having an exhaust pump 207 is provided in the chamber 201. Plasma is produced by a high frequency power supplied from a high frequency oscillator 205. In the embodiment, a frequency of high frequency power supplied from a high frequency oscillator 205 is 70 MHz. An applied power is 500 W. Although not shown, a unit for performing the impedance matching to the electrode and a blocking condenser are provided between the electrode and the oscillator.

Since the impedance matching cannot be performed in a frequency of 100 MHz or higher, discharge is unstable, and power loss is increased, so that such a frequency is not desired in general.

In the embodiment, hydrogen is used as a gas. Thus, using hydrogen plasma produced by a high frequency of 70 MHz, the amorphous silicon film 103 formed on the glass substrate 101 is processed. In this plasma processing, hydrogen atoms in the amorphous silicon film 103 is combined with hydrogen atoms in the plasma with a high energy state, so that a gas is generated and the dehydrogenation from the amorphous silicon film 103 progresses.

Figure 1B:
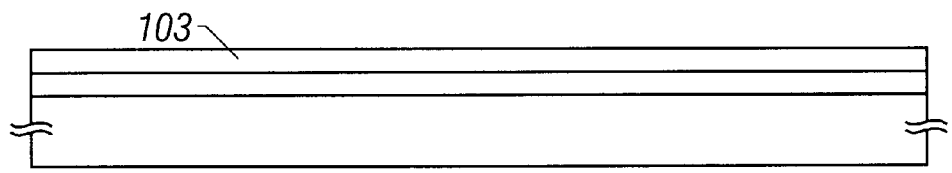
Figure 1C:
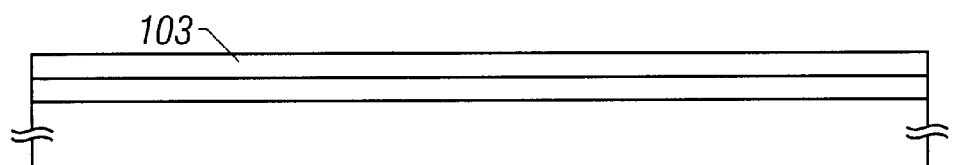

After the dehydrogenation is completed as shown in FIG. 1B, the heating treatment as shown in FIG. 1C is performed to crystallize the amorphous silicon film. In the embodiment, the heating treatment at 580° C. for 8 hours is performed to transform the amorphous silicon film 103 into a crystalline silicon film 105. (FIG. 1D)

When the above hydrogen plasma processing is performed, hydrogen in the amorphous silicon film 193 is released from the film thereby to obtain a state that silicon atoms are combined with one another easily. Thus, by the heating treatment, a crystalline silicon film having a high crystallinity can be obtained with high reproducibility. If the heating treatment at 580° C. for 8 hours is performed, a problem with respect to the deformation and the strain of the glass substrate may not occur.

Embodiment 2

Figure 1D:
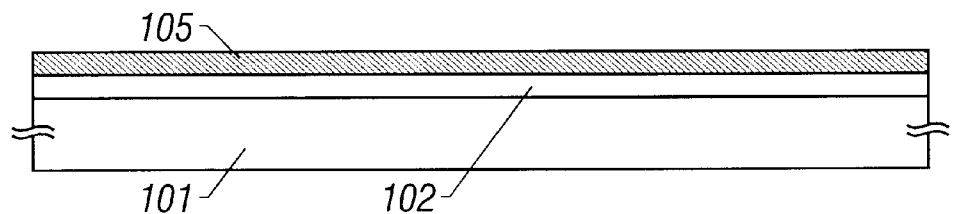

In the embodiment, after the state of FIG. 1D is obtained as in Embodiment 1, a laser light irradiation is performed. The crystalline silicon film 105 obtained by the heating treatment as shown in Embodiment 1 contains no small amorphous component therein. In order to crystalline such amorphous component, the heating treatment may be performed for a long time. However, if the heating treatment is not performed at 550° C. or higher for several hours or longer, an effect cannot be obtained. Thus it is not desired from a viewpoint of productivity.

Therefore, in the embodiment, a laser light irradiation is performed, so that an amorphous component which remains in the state of FIG. 1D is crystallized. As described above, Although an amorphous silicon film is transformed into a crystalline silicon film by the laser light irradiation, there in a problem with respect to its reproducibility. However, as in the embodiment, when a laser light is irradiated again into a silicon film which has been crystallized to increase the crystallinity thereof, it is found that very high reproducibility is obtained.

Although this cause is not clear, the following is considered. That is, if a laser light is irradiated into a region having an amorphous state in whole, sudden phase change occurs, so that the generation of crystal grain boundary and the nonuniform crystal growth occur uncertainly. Since these uncertain, reproducibility cannot be obtained.

On the other hand, in a case wherein crystallization is made as a whole but an amorphous component remains under a micro level, the generation of crystal grain boundary and the nonuniform crystal growth do not stand out by the laser light irradiation. Thus, the dispersion by an effect obtained by the laser light irradiation does not also stand out.

As a laser light, an excimer laser having a wavelength of an ultraviolet region is preferably used. In the embodiment, a KrF excimer laser (a wavelength of 248 nm) is irradiated with an irradiation energy density of 250 mJ/cm² to 300 mJ/cm².

Thus, the crystallinity of the crystalline silicon film 105 can be further increased. In a case wherein a thin film transistor (TFT) is produced, if an amorphous component remains in a crystalline silicon film constructing the active layer of the TFT, reproducibility and stability of the characteristic of a device are deteriorated by a dangling bond and a trap level caused by the dangling bond.

However, as in the embodiment, when by the laser light irradiation, an amorphous component is crystallized and its crystallinity is increased, reproducibility and stability of the characteristic of a semiconductor device to be obtained can be improved.

Embodiment 3

In the embodiment, a TFT is produced by using the crystalline silicon film formed by Embodiment 1 or 2. By using a method of Embodiment 1 or 2, a crystalline silicon film is formed on a glass substrate and then patterned to form an active layer of a TFT.

Figure 3A:
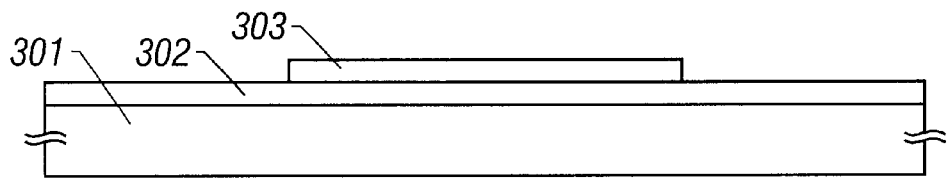
FIGS. 3A to 3D show a process for producing a thin film transistor.

This state is shown in FIG. 3A and that a silicon oxide film 302 is formed as an under film on a glass substrate 301 and an active layer 303 of a TFT is formed therein. In FIG. 3A, the under film has a thickness of 3000 Å, and the active layer 303 has a thickness of 500 Å and is constructed by a crystalline silicon film.

A silicon oxide film 304 which functions as a gate insulating film is formed at a thickness of 1000 Å by plasma CVD. Then, a film containing mainly aluminum to construct a gate electrode is formed at a thickness of 5000 Å by sputtering or electron beam evaporation. The film containing mainly aluminum contains scandium at 0.1 weight %.

Figure 3B:
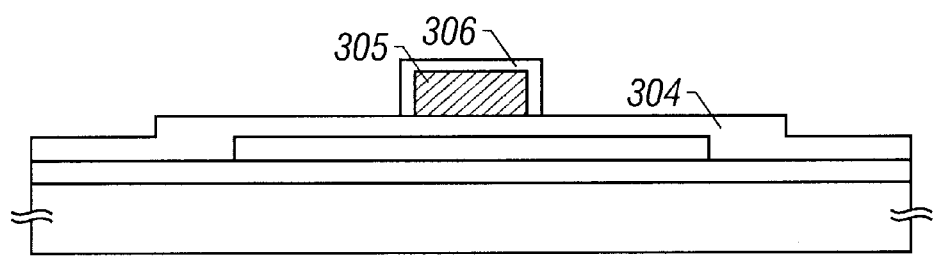

A gate electrode 305 made of a material containing mainly aluminum is formed by patterning. In an electrolytic solution, the anodization is performed using the gate electrode 305 as an anode, to form an anodic oxide film 306 having a thickness of 600 Å. (FIG. 3B)

A $P^+$ (phosphorus) ion is implanted using the gate electrode 305 and the anodic oxide film 306 as masks, to form an N-channel type TFT. If a P-channel type TFT is formed, $B^+$ (boron) ion may be implanted.

Figure 3C:
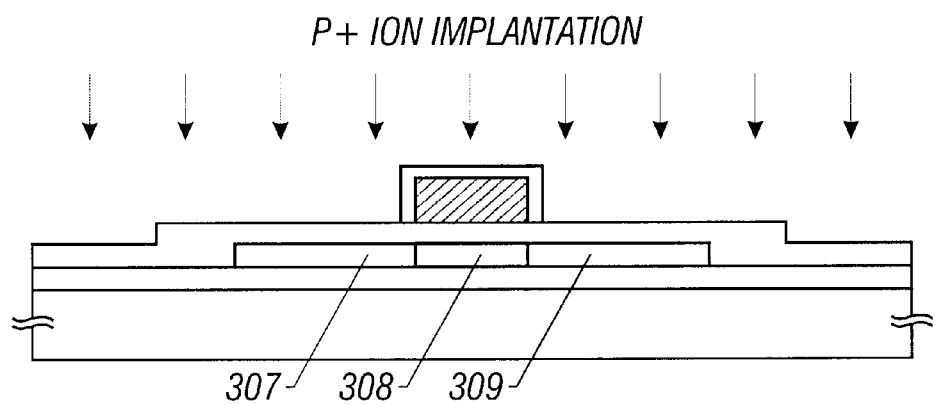
Figure 3D:
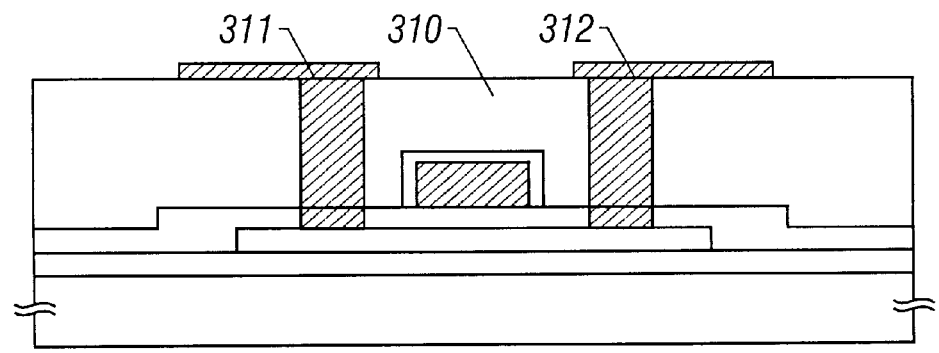
Figure 4:
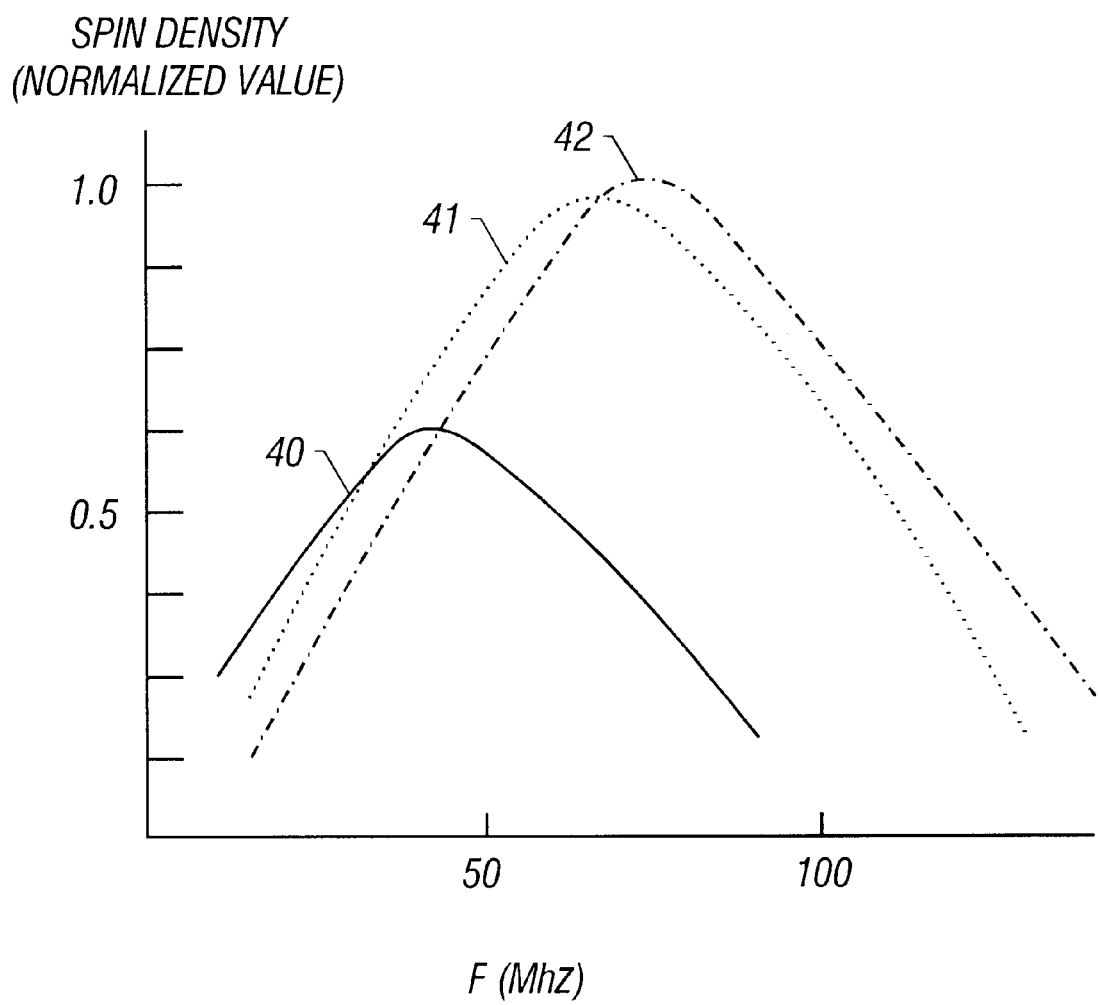
FIG. 4 shows a relationship between a frequency of a high frequency power for producing plasma and a spin density in an amorphous silicon film to be plasma-processed.

In the embodiment, the $P^+$ ion is implanted into regions 307 and 309 by plasma doping. Then, annealing is performed by the laser light irradiation, to form the source region 307 and the drain region 309. At the same time, a channel forming region 308 is defined. (FIG. 3C)

A silicon oxide film 310 having a thickness of 7000 Å is formed as an interlayer insulating film by plasma CVD. Contact holes are formed, and then a source electrode 311 and a drain electrode 312 are formed using a laminate film including a titanium film and an aluminum film. The titanium film may be formed by sputtering, and the aluminum film may be formed by evaporation.

According to the present invention disclosed in the specification, a crystalline silicon film can be obtained by the heating treatment at a temperature that a glass substrate can be resisted. Also, its reproducibility can be improved. Thus, a TFT having high performance characteristic can be obtained with high reproducibility.

What is claimed is:

1. A method for producing a semiconductor device comprising:
   forming a semiconductor film on a substrate having an insulating surface;
   producing a plasma using a gas including hydrogen; and
   removing hydrogen from said semiconductor film by plasma-processing the semiconductor film using the plasma.

2. The method of claim 1 wherein the semiconductor film is formed by low pressure thermal chemical vapor deposition.

3. The method of claim 1 further comprising heating the semiconductor film at 450° C. to 700° C. during the plasma-processing.

4. The method of claim 3 wherein said heating the semiconductor film is performed at 550 to 700° C.

5. The method of claim 1 further comprising at least one operation of crystallizing said semiconductor after said removing hydrogen.

6. The method of claim 5 wherein said crystallizing is done by at least one of heat treatment and laser light irradiation.

7. The method of claim 6 wherein an excimer laser is used in said laser light irradiation.

8. A method for producing a semiconductor device comprising:
   forming a semiconductor film on a substrate having an insulating surface;
   producing a plasma containing hydrogen;
   removing hydrogen from the semiconductor film using the plasma; and
   crystallizing said semiconductor film after said removing hydrogen using at least one of heat treatment and laser light irradiation.

9. The method of claim 8 wherein the semiconductor film is formed by low pressure thermal chemical vapor deposition.

10. The method of claim 8 further comprising heating the semiconductor film at 450° C. to 700° C. during the removing hydrogen.

11. The method of claim 8 wherein said plasma consists essentially of hydrogen and helium.

12. The method of claim 5 wherein an excimer laser is used in said laser light irradiation.

13. A method for producing a semiconductor device comprising:
   forming a semiconductor film on a substrate having an insulating surface;
   producing a plasma using a gas comprising hydrogen or helium at 50 vol % or more;
   removing hydrogen from the semiconductor film by treating the semiconductor film with the plasma; and
   after said removing hydrogen, crystallizing the semiconductor film by at least one of heat treatment and laser light irradiation of the semiconductor film.

14. The method of claim 13 wherein the semiconductor film is formed by low pressure thermal chemical vapor deposition.

15. The method of claim 13 wherein an excimer laser is used in said laser light irradiation.

16. A method according to claim 13, wherein said treating the semiconductor film with the plasma is performed at a temperature of 450–700° C.

17. A method according to claim 13, wherein said crystallizing using said heat treatment is performed at a temperature of 580° C. or less.

18. A method for producing a semiconductor device comprising:
   forming a semiconductor film on a substrate having an insulating surface;
   producing a plasma using a gas comprising hydrogen;
   plasma-processing the semiconductor film using the plasma to remove hydrogen from the semiconductor film;
   disposing a metal element which promotes crystallization of a material of said semiconductor film in contact with a surface of the semiconductor film after the plasma processing; and
   heating the semiconductor film using the metal element, after said disposing, to crystallize the semiconductor film.

19. The method of claim 18 wherein the metal element includes at least one of Fe, Co, Ni, Ru, Rh, Pd, Os, Ir, Pt, Cu, and Au.

20. The method of claim 18 wherein the semiconductor film is formed by low pressure thermal chemical vapor deposition.

21. The method of claim 18 further comprising the step of heating the semiconductor film at 450° C. to 700° C. during the plasma-processing.

22. The method of claim 18 wherein said plasma consists essentially of hydrogen.

23. The method of claim 18 wherein said plasma consists essentially of hydrogen and helium.

24. The method of claim 18 further comprising performing laser light irradiation for the silicon film after the heating.

25. The method of claim 24 wherein an excimer laser is used in said laser light irradiation.

26. A method according to claim 18, wherein said heating the semiconductor film using the metal element is performed at a temperature of 580° C. or less.

27. A method for producing a semiconductor device comprising:
   forming a semiconductor film on a substrate having an insulating surface;
   producing a plasma; and
   removing hydrogen from the semiconductor film using the plasma,
   wherein said plasma consists essentially of hydrogen.

28. A method according to claim 27, wherein said removing hydrogen step is performed at a temperature of 450–700° C.

29. A method of fabricating a semiconductor transistor comprising:
   providing a substrate having an insulating surface;
   forming a film that includes semiconductor on said insulating surface;
   removing hydrogen from said semiconductor film by treating said semiconductor film with an excited plasma;
   subsequently heating said semiconductor film in order to change at least a portion of the amorphous silicon to a more crystalline portion after the hydrogen is removed; and
   forming said transistor using the more crystalline portion of the semiconductor film,
   wherein said excited plasma is obtained by subjecting a gas including hydrogen to a frequency between 30 and 120 MHZ.

30. A method according to claim 29, wherein said treating the semiconductor film with the plasma is performed at a temperature of 450–700° C.

31. A method according to claim 29, wherein said heating the semiconductor film is performed at a temperature of 580° C. or less.

32. A method of producing a semiconductor device, comprising:
   forming a semiconductor film on an insulating surface of a substrate;
   introducing said semiconductor film into a chamber including a gas including hydrogen therein, said gas being one which can be excited to a plasma;
   exciting said plasma at a frequency that promotes release of hydrogen from said semiconductor film; and treating said semiconductor film with said plasma to release at least part of its hydrogen;

treating said semiconductor film with at least part of its hydrogen released with a laser in order to crystallize at least a portion of said semiconductor film.

33. A method as in claim 32 further comprising heating said semiconductor film with at least part of its hydrogen removed, in order to further change its crystal structure.

34. A method according to claim 32, wherein said treating the semiconductor film with the plasma is performed at a temperature of 450–700° C.

35. A method according to claim 8, wherein said crystallizing using said heat treatment is performed at a temperature of 580° C. or less.

* * * * *